United States Patent [19]

Takeda

[11] Patent Number: 4,632,899
[45] Date of Patent: Dec. 30, 1986

[54] PHOTOPOLYMERIZABLE IMAGE-RECORDING PROCESS OF PRODUCING A VISIBLE IMAGE

[75] Inventor: Keiji Takeda, Kanagawa, Japan

[73] Assignee: Fuji Photo Film Co., Ltd., Kanagawa, Japan

[21] Appl. No.: 677,453

[22] Filed: Dec. 3, 1984

[30] Foreign Application Priority Data

Dec. 1, 1983 [JP] Japan ................. 58-227437
Dec. 2, 1983 [JP] Japan ................. 58-228228
Dec. 5, 1983 [JP] Japan ................. 58-229376
Feb. 7, 1984 [JP] Japan ................. 59-20539

[51] Int. Cl.$^4$ .............................................. G03C 1/66
[52] U.S. Cl. ............................... 430/292; 430/281; 430/330; 430/351; 430/915
[58] Field of Search ............... 430/281, 292, 330, 351, 430/915

[56] References Cited

U.S. PATENT DOCUMENTS 4,251,619  2/1981  Kurita ..................... 430/292
4,298,678 11/1981  McKeever ................. 430/292
4,529,681  7/1985  Usami et al. ............. 430/281

FOREIGN PATENT DOCUMENTS 52-89915 7/1977 Japan .

OTHER PUBLICATIONS

Chang et al, Photographic Science and Engineering, 13 84(1969).

Primary Examiner—Jack P. Brammer
Attorney, Agent, or Firm—Sughrue, Mion, Zinn, Macpeak, and Seas

[57] ABSTRACT

An image-recording process is disclosed, which comprises using a photopolymerizable element comprising a polymerizable vinyl monomer and/or a polymerizable prepolymer, a photopolymerization initiator and a dye capable of being bleached with said vinyl monomer and/or prepolymer or a dye precursor capable of producing the bleachable dye upon being heated, conducting imagewise exposure to polymerize the photopolymerizable element, and heating it to bleach the dye with non-polymerized monomer and/or non-polymerized prepolymer remaining in portions not exposed or exposed or to bleach dye produced from the dye precursor upon heating. A negative working image-recording material for this process is also disclosed.

14 Claims, 17 Drawing Figures

PHOTOPOLYMERIZABLE IMAGE-RECORDING PROCESS OF PRODUCING A VISIBLE IMAGE

FIELD OF THE INVENTION

This invention relates to a light- and heat-sensitive, image-recording process (photothermography), particularly a novel recording process based on a photopolymerization reaction, and to a recording material for use in such a process.

BACKGROUND OF THE INVENTION

Photothermography is a technique of forming images by imagewise exposing a light-sensitive material and uniformly heating the exposed material to develop the same, having the advantage of providing images by simple dry processing. As light-sensitive materials for the photothermography, those which use organic silver salts are well known.

On the other hand, many image-recording processes utilizing a photopolymerization reaction are known and they have been applied to form photoresists and printing plates. However, except for special cases (for example, using monomers which themselves have color-forming ability such as N-vinylcarbazole-carbon tetrabromide type light-sensitive material), it has been difficult to form a visible image by photopolymerization using ordinary monomers, which has been one reason for the rather limited application of photopolymerization systems (and photopolymer systems) in ordinary photographic recording.

In order to obtain visible images, exposed areas or unexposed areas are selectively colored with a dye solution or a pigment powder based on the difference in permeability or adhesiveness therebetween, or previously colored light-sensitive layers are imagewise exposed and exposed areas are separately spaced unexposed areas by development such as liquid development or delamination development utilizing the difference in physical properties (e.g., solubility or adhesiveness) between hardened areas and unhardened areas. The above-described processings require complicated procedures, and more convenient processes for obtaining visible images have been desired.

Several processes for forming visible images by dry processing directly utilizing a chemical reaction in a light-sensitive material, i.e., without subsequently coloring from the outside or separately spacing exposed areas from unexposed areas using a photopolymerizable composition (or light-sensitive resin) have been proposed. Japanese Patent Application (OPI) No. 89,915/77 (The term "OPI" as used herein refers to a "published unexamined Japanese Patent Application") describes a process of forming a visible image by thermal development using a photopolymerizable composition (or a photopolymerizable light-sensitive resin) and a heat-sensitive, color-forming material. In this process, a material containing two components, i.e., two-heat-sensitive, color-forming substances separately dispersed on the inside and outside or on different sides of a photopolymerizable composition (or light-sensitive resin) are imagewise exposed and heated. Areas hardened by the exposure do not undergo coloring since the heat-sensitive substance does not migrate, whereas unexposed areas undergo coloring since the substance migrates. A positive-positive recording response is thus obtained.

Japanese Patent Application (OPI) Nos. 179,836/82, 197,538/82, 23,024/83, and 23,025/83 describe processes of forming visible images by applying pressure using a photopolymerizable composition and a heat-sensitive (pressure-sensitive) color-forming material. In these processes, a material containing one component of two-components type color-forming substance microencapsulated together with a photopolymerizable composition and the other component disposed on the outside of the microcapsules is imagewise exposed, and pressure is applied thereto. In this system, exposure-hardened capsules are not ruptured and thus no coloration takes place in exposed areas, whereas capsules in unexposed areas are ruptured by the pressure to bring the two components of the color-forming substance into contact with each other, thereby causing as reaction therebetween them to form color. Thus, a positive-positive recording response is obtained.

All of these light- and heat-sensitive or light- and pressure-sensitive, image-recording processes using photopolymerization reaction are based on imagewise controlling the coloration reaction by a difference in material migration diffusibility between polymers and monomers. However, the degree of hardening by photopolymerization, i.e., the "barrier" to material migration is not necessarily proportional to the polymerization degree and, when the polymerization degree reaches a certain level (gelation point), rapid gelation takes place, leading to the sudden appearance of "barrier" properties. Therefore, in the above-described image-recording processes, image density is made proportional to the exposure amount only with difficulty. Thus, such processes are poor in gradation reproducibility. In addition, it is generally difficult for the polymer produced by the photopolymerization to completely stop material migration therethrough and, in order to obtain sufficient "barrier" properties, an extremely high exposure amount is required, which involves the defects of increased fog, an insufficient signal/noise ratio (S/N ratio), and insufficient recording sensitivity.

SUMMARY OF THE INVENTION

A fundamental object of the present invention is to provide a non-silver salt, image-recording process which enables one to record color images by dry processing.

A more specific object of the present invention is to provide a novel, dry process for forming visible images which provides images having excellent gradation reproducibility and an excellent S/N ratio utilizing a photopolymerization reaction.

These and other objects of the present invention will become apparent from the following disclosure.

The above-described and other objects of the present invention are attained by an image-recording process which comprises using a photopolymerizable element comprising a polymerizable vinyl monomer and/or a polymerizable prepolymer and a photopolymerization initiator and a dye capable of being bleached with the vinyl monomer and/or prepolymer or a dye precursor capable of producing the bleachable dye upon being heated, conducting imagewise exposure to polymerize the photopolymerizable element, and heating it to bleach the dye (or a dye produced from the dye precursor upon heating) with non-polymerized monomer and/or non-polymerized prepolymer remaining in areas not exposed or exposed in an amount insufficient to cause polymerization.

BRIEF DESCRIPTION OF THE DRAWINGS

In FIGS. 1 through 7, numeral 1 designates an image-recording material, 2: a light-sensitive sheet, 3: a heat-sensitive color-forming sheet, 4: a developing sheet, 5: a light-sensitive layer, 10: light-sensitive particles, 6: a heat-sensitive, color-forming layer 7: a developing layer, 8: a support, 9: a barrier layer, 11: a polymer image, and 12: a dye image.

DETAILED DESCRIPTION OF THE INVENTION

Figure 1:
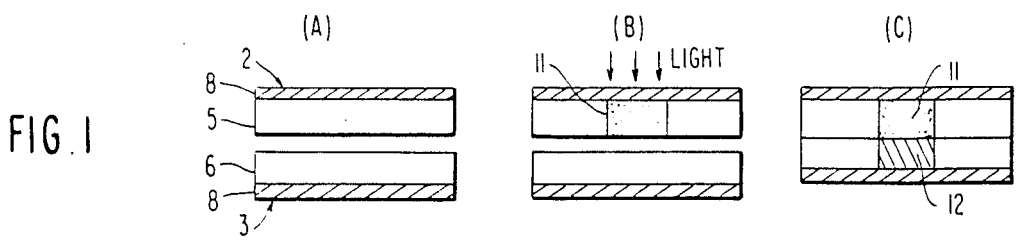
FIGS. 1 to 5 illustrates different embodiments of image-recording processes per the present invention. In respective drawings, (A) shows an image-recording material before exposure, (B) shows the same after imagewise exposure, and (C) shows the same after thermal development.

More specific embodiments of the present invention include the following embodiments (1) to (5).

(1) A light-sensitive element comprising a polymerizable vinyl monomer and/or a polymerizable prepolymer and a photopolymerization initiator is imagewise exposed, the exposed element is intimately contacted with an element comprising a dye capable of being bleached with the polymerizable vinyl monomer and/or the polymerizable prepolymer or is intimately contacted with a heat-sensitive, color-forming element comprising a dye precursor capable of producing the bleachable dye upon heating, and the resulting assembly is heated to form a dye image.

(2) An image-recording element having a light-sensitive layer comprising a polymerizable vinyl monomer and/or polymerizable prepolymer and a photopolymerization initiator and a dye layer comprising a dye capable of being bleached with the polymerizable vinyl monomer and/or the polymerizable prepolymer or a heat-sensitive, color-forming layer comprising a dye precursor capable of producing the aforesaid bleachable dye upon being heated is imagewise exposed, and then heated to form a dye image.

(3) An image-recording element which has a dye layer comprising a dye capable of being bleached with a polymerizable vinyl monomer and/or a polymerizable prepolymer or a heats-sensitive, color-forming layer comprising a dye precursor capable of producing the bleachable dye upon being heated, and which has a mixture of the polymerizable vinyl monomer and/or the polymerizable prepolymer and the photopolymerization initiator dispersed in said dye layer or said heat-sensitive, color-forming layer, is imagewise exposed and then heated to form a dye image.

(4) A light-sensitive element comprising a polymerizable vinyl monomer and/or a polymerizable prepolymer, a photopolymerization initiator and a color former is imagewise exposed, then heated in intimate contact with a developing element comprising a color developer.

(5) A heat-sensitive recording material having a light-sensitive layer comprising a polymerizable vinyl monomer and/or a polymerizable prepolymer, a photopolymerization initiator, and a color former and a developing layer comprising a color developer is imagewise exposed and then heated to form a dye image.

The present invention is described in more detail below.

The image-recording process of the present invention is based on the phenomenon that polymerizable vinyl monomers and/or polymerizable prepolymers (hereinafter abbreviated as monomers) have the ability of bleaching certain kinds of dyes, which ability is lost when the monomers are polymerized to polymers. This principle is completely different from that on which conventionally known processes are based. That is, with conventional image recording utilizing photopolymerization, exposed areas and unexposed areas are distinguished from each other by wet or dry processing only utilizing the difference in physical properties (e.g., solubility in a solvent, permeability or penetrability of a substance, stickiness, adhesiveness, light-scattering properties, etc.) between the monomers and the polymers produced therefrom by polymerization, or are optically discriminated from each other by controlling the light-scattering properties thereof to thereby develop an image or render the image visible. The dry, visible image-forming processes proposed in the aforementioned Japanese Patent Application (OPI) Nos. 89,915/77, 179,836/82, 197,538/82, 23,024/83, and 23,025/83, and "photographic Science Engineering 13, 84 (1969)" are also based on the principle of controlling a coloration reaction utilizing the difference in physical properties (permeability for a substance) between monomers and polymers.

In contrast, the image-recording process of the present invention is based on the novel principle that some dyes are bleached only with monomers remaining in unexposed areas after imagewise photopolymerization. Although the present invention seems analogous to the processes and materials described in the foregoing Japanese Patent Application (OPI) No. 89,915/77, etc. in that two-heat- (or pressure-) sensitive color-forming substances are used as a visible image-forming element, the present invention is clearly distinguished from such conventional processes and materials. This can be seen, for example, by the fact that image recording by the process described in Japanese Patent Application (OPI) Nos. 89,915/77, etc. is based on a positive-positive response, whereas the process of the present invention provides a negative-positive response.

Using the above-described principle to bleach a dye with a monomer provides the image recording process of the present invention with several important merits with respect to recording procedures, applications, and photographic properties.

With respect to recording procedure, a fixed visible image is formed only by heating the imagewise exposed material. Non-polymerized monomer is consumed in bleaching the dye, and hence no polymerization takes place upon further irradiation, and thus no fog is produced in white background areas.

In the case of using a substance capable of forming color upon heating (e.g., a two-component type heat-sensitive, color-forming substance) as a visible image-forming element in place of a preformed dye, further heating also causes no coloration and, therefore, no fogging, because a color formed upon heating in white background areas has already been bleached with the monomer. That is, in the process of the present invention, a visible image developed by heating is simultaneously stabilized against light and heat (is fixed), whereby additional fixing becomes unnecessary.

Comparison with other photothermographic techniques easily reveals the benefits of the present invention. For example, with organic silver salt type photothermography, light sensitivity is not generally lost after thermal development. Therefore, when a formed image is exposed to light for a long time, fog is formed in white background areas. Further, when the image is heated in error after being exposed to room light, high-density fog is formed in white background areas, the image thus disappearing. In the photothermography described in aforementioned Japanese Patent Application (OPI) No. 89,915/77, a formed image is stabilized against light, but not completely stabilized against heat as even when monomer is supposedly completely polymerized, the resulting polymer generally has a comparatively low softening point and therefore uncompletely prevents diffusion of a color-forming substance and fog formation due to reaction of the substance thereby.

With respect to merits in application, the process of the present invention can be applied to color image recording as well as monochromatic (e.g., black-and-white) image recording. As will be described in detail hereinafter, the photopolymerization system can be selectively spectrally sensitized for red, green or blue light. Therefore, a color image can be recorded by one color light image exposure and one heating procedure using a light-sensitive material having a red-sensitive layer, green-sensitive layer, and blue-sensitive layer respectively associated with cyan, magenta, and yellow dyes or dye precursors capable of forming these colors upon heating.

The principle of bleaching a dye with a monomer employed in the present invention provides the following merits with respect to photographic properties.

Firstly, it provides good gradation reproducibility. This is atributed to the fact that image density is accurately proportional to the amount of consumed monomer, i.e., proportional to the conversion (yield of polymerization) of monomer to polymer because the number of monomer molecules is proportional to the number of dye molecules bleached therewith (or the monomer and the dye are in a stoichiometric relationship with each other). The conversion of monomer to polymer is generally proportional to the exposure amount, and, hence, image density is proportional to the exposure amount (at least in regions where the exposure amount is not enough to give saturated density (Dmax)). As a result, extremely good gradation reproducibility can be attained. This is a great merit over known processes where polymers are used as barriers for material migration to form visuable images. In known processes, the exposure amount is generally not proportional to the amount of material migration (therefore image density) and, since the amount of material migration tends to sharply decrease when the exposure amount exceeds a certain level, the response behavior is approximately an on-off response, rather than providing continuous gradation, and thus obtaining good gradation is difficult.

Secondly, images with less fog and a high S/N ratio can be obtained per the present invention. This is attributed to the fact that, when the weight ratio of the monomer to the dye (or dye precursor) present in a light-sensitive material is adjusted to a proper level (for example, the monomer being present a bit excess by e.g., 1.5 moles of monomer per 1 mole of the dye), fog can be completely removed without any substantial reduction in maximum image density. On the other hand, with a process forming visual images using polymers as a barrier, fog is increased when maximum density is raised unless the ratio of the material migration rate in polymer to that in monomer is extremely high.

The image-recording process of the present invention involves several embodiments in which components are disposed in different manners. Different embodiments are illustrated in FIGS. 1 to 7, through the present invention is not limited only to them. (Additionally, in every figure, only the case of using a dye precursor which is colorless at room temperature and which, upon heating, forms a color to produce a dye is illustrated, the case of using a dye being omitted.)

FIG. 1 illustrates the case of conducting image recording using a light-sensitive element comprising a photopolymerizable element (a monomer and a photopolymerization initiator) and a two-component type heat-sensitive, color-forming element comprising a color former and a color developer. The color former is a colorless compound which is capable of giving a dye on reaction with the color developer. FIG. 1(A) shows an image-recording material comprising two sheets (light-sensitive sheet 2 and heat-sensitive, color-forming sheet 3) comprising support 8 having provided thereon light-sensitive layer 5 containing a photopolymerizable element or heat-sensitive, color-forming layer 6 containing a combination of a color former and a color developer. FIG. 1(B) shows the state of imagewise exposing the light-sensitive layer, in which photopolymerization takes place in exposed areas to convert monomer to polymer 11. FIG. 1(C) shows the state of intimately contacting the coated side of the light-sensitive element with the coated side of the heat-sensitive, color-forming element, and heating the assembly to develop a dye image. The heat-sensitive, color-forming layer 6 is initially colored all over but, in a short time, non-polymerized monomer in unexposed areas of the light-sensitive layer 5 diffuses thereinto under heating to bleach the dye. On the other hand, in portions corresponding to exposed areas of light-sensitive layer 5, monomer has been polymerized and consumed and thus dye bleaching does not take place. As a result, dye image 12 of a negative-positive response with respect to the original is formed in the heat-sensitive, color-forming layer 6. After the development, the two sheets may be peeled apart. However, when at least one of supports 8 is transparent, the assembly may be used as a final image without the peel-apart procedure since the polymers themselves are generally colorless.

FIG. 1 shows an embodiment involving exposing light-sensitive layer 5 from the back side of the support, but the exposure may be conducted from the surface side. Heat-sensitive, color-forming layer 6 may be previously uniformly heated to color the same all over prior to thermal development, which leads to the same results. This previously heating case is the same as the case of using a dye in place of a dye precursor in heat-sensitive, color-forming layer 6.

Figure 2:
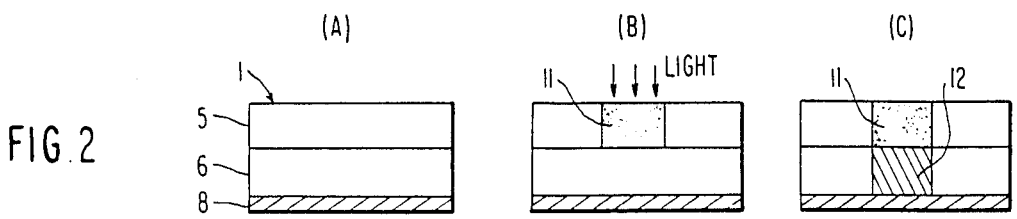

FIG. 2 illustrates the case of conducting image recording using a layered, mono-sheet type image-recording material which comprises a support having provided thereon a light-sensitive layer comprising a photopolymerizable element and a heat-sensitive, color-forming element comprising a color former and a color developer. FIG. 2(A) shows image-recording material 1 comprising support 8 having provided thereon light-sensitive layer 5 and heat-sensitive, color-forming layer 6. FIG. 2(B) shows the state of imagewise exposing the recording material. Photopolymerization takes place in exposed areas to produce polymer 11. FIG. 2(C) shows the state of heating the exposed material to develop the dye image. The heat-sensitive, color-forming layer 6 is initially colored all over but, in a short time, is imagewise bleached with unpolymerized monomer diffusing thereinto from unexposed portions of light-sensitive layer 5, with no bleaching taking place in exposed areas. Thus, dye image 12 of a negative-positive response with respect to the original is formed in the heat-sensitive, color-forming layer. Additionally, the order of layer 5 and layer 6 may be reverse to that shown in FIG. 2, and a barrier layer may be provided between layer 5 and layer 6. The purpose for providing barrier layer is as follows. In the case of, for example, using a color developer which is one component of the dye precursor and also functions as a polymerization inhibitor (for example, in the case of using a two-component type heat-sensitive, color-forming substance comprising a fluoran and a phenol as a dye precursor, the phenol shows the effect of inhibiting or decelerating polymerization), an intermediate layer (a barrier layer) is preferably provided in order to prevent contact of the color developer with the monomer. In the case of using a dye in place of the dye precursor in layer 6, a barrier layer can prevent the dye in layer 6 from being bleached with monomer possibly diffused from layer 5 during a long storage period after coating.

Figure 3:
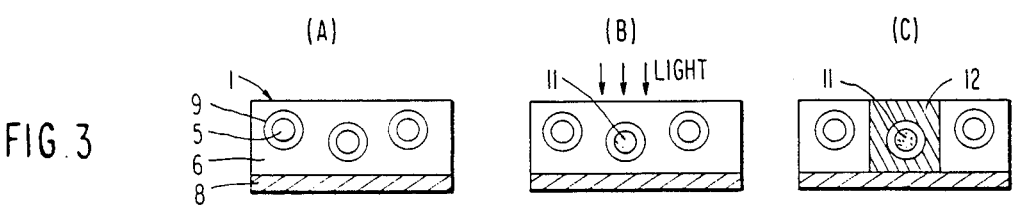

FIG. 3 illustrates the case of conducting image recording using a single-layer, mono-sheet type image-recording material having a single layer of a mixture of a photopolymerizable material and a dye precursor. FIG. 3(A) shows image-recording material 1 comprising support 8 having provided thereon dye precursor-containing layer 6 containing photopolymerizable element 5 surrounded by barrier layer 9. The photopolymerizable element surrounded by the barrier layer is generally prepared as microcapsules and is dispersed as a non-continuous phase in a continuous phase containing a dye precursor. The purpose for providing the barrier layer is the same as with the layered mono-sheet type material shown in FIG. 2. FIG. 3(B) shows the state of imagewise exposing the image-recording material, with monomer in exposed portions being photopolymerized to produce polymer 11. FIG. 3(C) shows the state of heating the exposed material to develop the dye image. Dye image 12 is formed in exposed areas.

Figure 4:
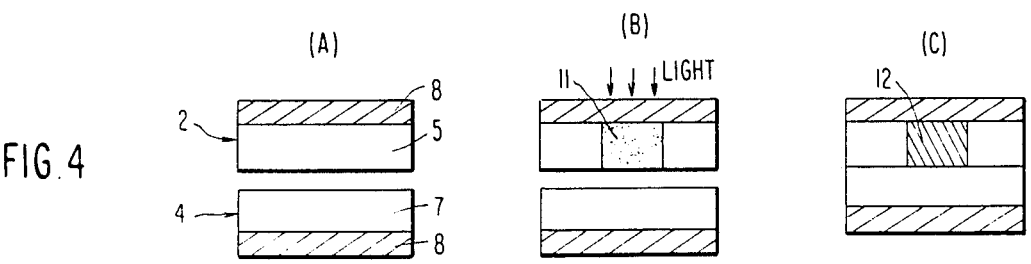
Figure 5:
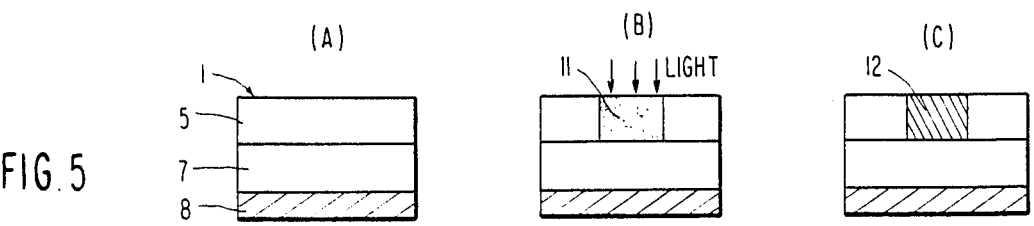

FIGS. 4 and 5 illustrate embodiments of conducting image recording using image-recording materials wherein a dye precursor composed of a color former and a color developer is not incorporated in the same layer, with the color former being incorporated in a photopolymerizable element. FIG. 4 shows the case of conducting image recording using a light-sensitive sheet comprising a photopolymerizable element and a color former, and a developing sheet comprising a color developer. FIG. 4(A) shows an image-recording material comprising a combination of two sheets, light-sensitive sheet 2 which comprises support 8 having provided thereon light-sensitive (and color-forming) layer 5 containing a photopolymerizable element comprising a polymerizable vinyl monomer (prepolymer) and a photopolymerization initiator and a color former and developing sheet 4 which comprises support 8 having provided thereon developing layer 7 containing a color developer. FIG. 4(B) shows the state of such an imagewise exposed light-sensitive sheet wherein monomer in exposed areas is polymerized to polymer 11. Additionally, the exposure may be conducted from the reverse side from the light-sensitive layer side and may be conducted with the developing sheet in an intimate contact with the light-sensitive sheet. FIG. 4(C) shows the state of the system after heating the exposed light-sensitive sheet and the developing sheet in intimate contact with each other to develop. Upon heating, the color developer in the developing sheet diffuses into the light-sensitive layer to react there with the color former and form a dye. In unexposed areas the thus formed dye is bleached with remaining monomer. As a result, dye image 12 is formed in exposed areas.

FIG. 5 illustrates the case of conducting image recording using a layered mono-sheet type image-recording material which comprises a single support having provided thereon a light-sensitive layer comprising a photopolymerizable element and a color former and a developing layer comprising a color developer.

FIG. 5(A) shows an image-recording material which comprises support 8 having provided thereon light-sensitive layer 5 comprising the photopolymerizable element and the color former and developing layer 7 comprising the color developer. The order of the layer may also be the reverse of that illustrated in FIG. 5(A).

FIG. 5(B) shows the material after imagewise exposure, wherein polymer 11 is produced in exposed areas.

FIG. 5(C) shows the material after thermal development, wherein dye image 12 is formed in the light-sensitive layer the same as FIG. 4.

In the embodiment shown in FIG. 5, a barrier layer may be provided between the light-sensitive layer and the developing layer. When the color developer possesses a photopolymerization inhibiting effect, this barrier layer functions to prevent developer from diffusing into the light-sensitive layer at room temperature.

In order to record a color image, a color image can be immediately recorded by superposing three units of the structure shown in FIG. 3, each containing a combination of a properly disposed and properly associated photopolymerization initiator sensitive to red, green or blue light, and a dye or dye precursor of the cyan, magenta, or yellow type, and exposing the assembly through a color original, followed by thermal development. As an alternative process, a color image can be recorded using three units of the structure shown in FIG. 2 or 5 similarly superposed one over the other as described above. With these cases, barrier layers are preferably provided between respective units for the purpose of preventing color mixing due to diffusion of monomer or color developer from unit to unit.

Figure 6:
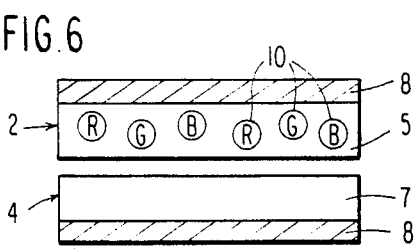
FIGS. 6 and 7 show two different embodiments of color image-recording materials.
Figure 7:
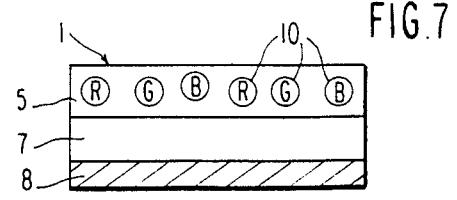

Further, color image can be recorded by using image-recording materials as shown in FIGS. 6 and 7. These materials possess light-sensitive layers containing dispersed in one and the same layer three combinations of photopolymerizable elements (sensitive to red, green, and blue, respectively) and color formers (forming cyan, magenta, and yellow colors, respectively) corresponding to the three primary colors. Numeral 5 in FIGS. 6 and 7 designates a light-sensitive layer wherein an emulsion or microcapsule particles 10 containing both the photopolymerizable element and the color former are dispersed in continuous binder phase. R contains a photopolymerization initiator sensitive to red light and a cyan color former, G contains a photopolymerization initiator sensitive to green light and a magenta color former, and B contains a photopolymerization initiator sensitive to blue light and a yellow color former. These three kinds of particles are uniformly dispersed in the continuous phase as picture elements.

In FIG. 6, numeral 2 designates a light-sensitive sheet comprising support 8 having provided thereon light-sensitive layer 5, and 4 designates a developing sheet comprising support 8 having provided thereon developing layer 7 containing a color developer.

In FIG. 7, numeral 1 designates a layered, mono-sheet type image-recording material comprising support 8 having provided thereon light-sensitive layer 5 and developing layer 7 containing a color developer. The recording materials shown in FIGS. 6 and 7 respectively correspond to the materials for recording a mono-color image shown in FIG. 4(A) and FIG. 5(A), and negative-positive response type color image recording can be conducted by exposing them with a color light image followed by thermal development.

Additionally, the quantity or ratio of the three kinds of particles in the light-sensitive layer shown in FIG. 6 or 7 is desirably selected so that an image obtained by exposure with white light becomes natural gray or black. This can vary depending upon the sensitivity of each photopolymerization initiator and upon the density of the color obtained by the reaction between the color former and a definite amount of color developer, this being properly decided in individual cases.

Imagewise exposure may be conducted using any light source that contains a light component in the wavelength region to which the photopolymerization initiator responds. For example, a tungsten lamp, a xenon lamp, a mercury lamp, etc., may be used. The exposure amount is preferably $10^3$ to $10^8$ erg/cm$^2$.

Thermal development may be conducted using conventional means such as a hot plate, a heat roller, an infrared heater, or the like. The temperature of thermal development is generally 80° to 200° C., preferably 100° to 150° C. The developing time generally ranges from 3 seconds to 120 seconds, preferably from 10 seconds to 60 seconds.

"Polymerizable vinyl monomers" as used in the present invention means compounds which possess from 1 to 10 vinyl or vinylidene groups and which can undergo radical polymerization. As such monomers, known acrylic and methacrylic esters having 700 or less of carbon atoms, metal salts of acrylic acid (e.g., barium acrylate, calcium acrylate, etc.), acrylamide, N,N-methylenebisacrylamide, vinyl ethers, N-vinyl compounds (e.g., N-vinylcarbazole), vinyl acetate, etc., can be used. Of these, monomers or prepolymers of acrylic and methacrylic esters are particularly suited for the present invention. For example, the following prepolymers are preferably used.

bromine atom, a methoxy group, an ethoxy group, an acetyl group and an alkyl group having 1 to 5 carbon atoms. As alcohol components for the ester prepolymers, the above-described alcohols further containing an ester bond, urethane bond, etc. (e.g., oligomers formed by reacting the above-described alcohols with polybasic acids, isocyanates, etc.) are generally used. Specific examples thereof are illustrated below by reference to acrylic esters. Specific examples of compounds formed by replacing one or all of the acryloyl groups of the acrylic esters by methacryloyl groups, that is, acrylic acid-methacrylic acid mixed esters and methacrylic esters, are omitted, but they can also be used in the present invention similar to the acrylic esters.

For example, there can be illustrated monoacrylates, diacrylates, tri- and tetra-acrylates and the polymerizable prepolymers preferably having a weight average molecular weight of 10,000 or less.

The monoacrylates used in the present invention have an alcohol moiety derived from a straight or branched monoalcohol having 1 to 20 carbon atoms which may be substituted by an alkoxy group having 1 to 5 carbon atoms; a halogen atom such as a chlorine atom, a bromine atom and an iodine atom; a phenyl group which may have a substituent such as a halogen atom e.g., a bromine atom and a chlorine atom, a methoxy group, an ethoxy group, an acetyl group, an alkyl group having 1 to 5 carbon atoms; etc. (e.g., methyl acrylate, ethyl acrylate butyl acrylate, etc.). The diacrylates are obtained by a reaction of acrylic acid and dialcohol, trialcohol, tetra-alcohol or penta-alcohol having 1 to 20 carbon atoms which may be substituted by the same substituent as that for the above monoalcohol (e.g., polyethylene glycol diacrylate, polypropylene glycol diacrylate, hexanediol diacrylate, glycerin diacrylate, trimethylolpropane diacrylate, pentaerythritol diacrylate, etc.). The triacrylates are obtained by a reaction of acrylic acid and trialcohol, tetra-alcohol or penta-alcohol having 1 to 20 carbon atoms which may be substituted by the same substituent as that for the above monoalcohol (e.g., trimethylolpropane triacrylate, pentaerythritol triacrylate, etc.). The tetra-acrylates are obtained by a reaction of acrylic acid and tetra-alcohol, or penta-alcohol having 1 to 20 carbon atoms which may be substituted by the same substituent as that for the above monoalcohol (e.g., pentaerythritol tetra-acrylate, etc.). The polymerizable prepolymers are illustrated by oligomers formed by reacting the hydroxy residue of a polyester produced by condensation between a polybasic acid (e.g., phthalic acid, isophthalic

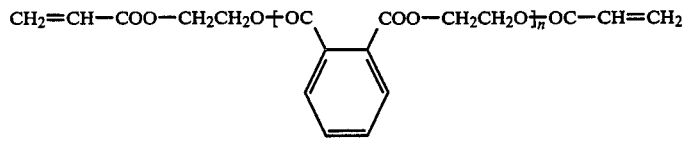

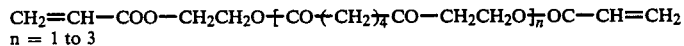
n = 1 to 3

As alcohol components for the ester monomers, straight or branched chain aliphatic, mono- to deca-hydric alcohols containing 1 to 20 carbon atoms are used. The alcohols may optionally be substituted by an alkoxy group containing 1 to 5 carbon atoms, a halogen atom (Cl, Br or I), a phenyl group, or a substituted phenyl group, the substituent for the phenyl group being, for example, a halogen atom such as a chlorine atom and a acid, terephthalic acid, maleic acid, fumaric acid, malonic acid, succinic acid, adipic acid, etc.) and polyhydric alcohol (e.g., ethylene glycol, propylene glycol, polyethylene glycol, polypropylene glycol, glycerin, trimethylolpropane, trimethylolethane, pentaerythritol, etc.) with acrylic acid, i.e., polyester acrylates (or oligoester acrylates) as described in Japanese Patent Publication No. 7361/77, polyurethane acrylates obtained by reaction between a hydroxy-containing acrylic ester and an isocyanate, as described in Japanese Patent Publication No. 41,708/73, epoxyacrylates, etc.

Additionally, two or more monomers may be used in the present invention.

As the photopolymerization initiators used in the present invention, there are illustrated, for example, carbonyl compounds (e.g., ketones such as acetophenone, benzoins, benzyl, diacetyl, benzophenones, etc., and quinones such as anthraquinones, naphthoquinones, phenanthrenequinones, etc.) as described in Oster et al; "Chemical Review", 68, 125-151 (1968) and Kosar; "Light-Sensitive Systems" (John Wiley & Sons, 1965), pp. 158-193, organic sulfur compounds, peroxides, halogen compounds, photo-semiconductors (e.g., zinc oxide, titanium dioxide, etc.), metal ions (e.g., iron (I) ion, metal carbonyls, metal complexes, uranyl salts, etc.), silver halide, azo and diazo compounds, photoreducible dyes, etc. Of these, photo-reducible dyes are preferably used in the present invention in that they can spectrally sensitize photopolymerization to any wavelength region in the visible region and are therefore useful for color image recording.

Photopolymerization initiators using the photo-reducible dyes which is reducible by an action or hydrogen-donating compound at a photo-excitation state generally comprise a photo-reducible dye and a reducing agent (or a hydrogen-donating compound), and produce radicals which can initiate polymerization upon reaction between light-excited dye and reducing agent. The photo-reducible dyes include Methylene Blue, Methylene Green, Thionine, Rose Bengale, Erythrosine B, Eosine, Rhodamine, Phloxine B, Safranine, acriflavine, riboflavine, fluoresceine, uranine, benzoflavine, N,N,N',N'-tetra-n-butylthionine, N,N,N'N'-tetramethyl-4'-dodecylsafranine, Acridine Orange, Acridine Yellow, 9,10-phenanthrenequinone, benzanthrone or like carbonyl compounds, etc. Of these, Methylene Blue, methylene Green, Thionine, Rose Bengale, Erythrosine B, Eosine, Phloxine B, Safranine, Phenosafranine, Acriflavine, and Acridine Yellow were found to give the highest light sensitivities.

As the reducing agents, there can be illustrated β-diketones (e.g., dimedone (5,5-dimethyl-1,3-cyclohexanedione), acetylacetone, etc.), amines (e.g., triethanolamine, diethanolamine, monoethanolamine, dimethylamine diethylamine, tetramethylethylenediamine, triethylamine, phenylhydrazine, etc.), sulfinic acids (e.g., p-toluenesulfinic acid, benzenesulfinic acid, p-(N-acetylamino)benzenesulfinic acid, etc.) and the salts thereof (e.g., sodium salt, potassium salt, etc.), N-phenylglycine, L-ascorbic acid, thiourea, allylthiourea, etc. Of these, dimedone is particularly preferable. The molar ratio of the photo-reducible dye to the reducing agent to be used in the photopolymerizable element varies depending upon their solubilities in a solvent, etc., but generally, 0.3 to 200 mols, more preferably 1 to 20 mols, of the reducing agent is used per mol of the photo-reducible dye. In the case of using a carbonyl compound such as 9,10-phenanthrenequinone, reducing agents need not be used because the binder functions as a hydrogen donating compound.

Dyes capable of being bleached with vinyl monomers used in the present invention or dye precursors capable of producing such dyes upon heating can be selected through a simple test as described below. That is, a dye or a dye precursor to be tested is dissolved or dispersed in a 5 wt% gelatin aqueous solution and is coated on a transparent film in a dry thickness of about 5 μm and then dried. Where the sample to be tested is a dye precursor, it is heated at 150° C. for one minute to form color. The coated amount of the dye or dye precursor is adjusted so as to give a transparent optical density of 1.0 to 1.5. Then, a drop (about 0.1 g) of a 30% aqueous solution of polyethylene glycol diacrylate (the number of —O—CH$_2$CH$_2$— groups being optionally selected between 2 and 15) is applied thereto, and the sample is left for one minute at a room temperature. If the dye in the center of the applied drop is bleached to a transparent optical density of 0.3 or less, the dye or dye precursor can be used in the present invention. Generally, those which are bleached to a transparent optical density of more than 0.5 are not preferred.

The dyes and dye precursors used in the present invention are those which are known, two-component type color-forming substances (dye precursors) generally used for heat-sensitive or pressure-sensitive materials and dyes obtained by heating them or subjecting them to solution reaction to form a color. A two-component type color-forming substance consists of two components, a color former and a color developer. In general, when they are brought into contact, these two components react with each other, even at room temperature, to form a dye. An embodiment wherein the two components are dispersed in a binder in a state of not being in contact with each other yields a dye precursor of the present invention for forming a visible image. In this embodiment, at least one of the two components is melted upon heating, and diffuses to contact with the other component to react and form color.

Specific examples of the color formers of the two-component type color-forming substances are illustrated below: triphenylmethanelactones (or triphenylmethanephthalides) as described in U.S. Pat. Nos. 2,548,366 and 2,505,472, and Japanese Patent Application (OPI) No. 56,224/78 (corresponding to British Patent No. 1,590,915), such as Crystal Violet lactone, malachite Green lactone, etc.; fluorans as described in Japanese Patent Publication Nos. 18,726/74, 18,727/74, 4,698/70, 4,701/70, 29,550/71, 4,051/73, 4,052/73, 4,614/71, 8,725/73, 8,726/73, 10,871/77, 23,203/76, and 29,662/72, and Japanese Patent Application (OPI) No. 82,243/77, such as 3,6-dimethoxyfluoran, 2-methyl-6-isopropylaminofluoran, 2-bromo-3-chloro-6-n-propylamino-7-bromofluoran, 3-diethylamino-7-dibenzylaminofluoran, 3-dimethylamino-7-methylaminofluoran, 4,5,6,7-tetrachloro-1',2',3'-trimethyl-6'-diethylaminofluoran, 3-diethylamino-5,6-benzofluoran, 3-diethylamino-7,8-benzofluoran, 2-N-ethyl-N-phenylamino-6-diethylaminofluoran, 2-N-phenylamino-3-methyl-6-diethylaminofluoran, 2-N-phenylamino-3-methyl-6-N-ethyl-N-(p-tolyl)-aminofluoran, 3-diethylamino-7-phenylfluoran, 3',6'-bis(N-methyl-N-phenylamino)4,5,6,7-tetrachlorofluoran, 2-ethoxyethylamino-3-chloro-6-diethylaminofluoran, etc.; azaphthalides and diazaphthalides as described in Japanese Patent Publication Nos. 8,727/73, 8,728/73, 8,729/73, 8,730/73, and 18,725/73, such as 3-(4'-diethylaminophenyl)-3-(4'-dimethylamino-2'-chlorophenyl)-7-azaphthalide, 3,3-bis(4'-dimethylaminophenyl)-4,7-diazaphthalide, etc.; fluoran-gamma-lactams (rhodamine lactams) as described in Japanese Patent Publication Nos. 29,662/72 and 103,710/74; phenothiazines as described in Japanese Patent Application (OPI) Nos. 45,319/73 and 34,427/72, such as Benzoyl Leucomethylene Blue;

indolylphthalides as described in Japanese Patent Application (OPI) No. 46,010/72 and British Patent No. 1,160,940; and spiropyrans as described in Japanese Patent Publication Nos. 14,873/61 and 10,783/72, and Japanese Patent Application (OPI) No. 95,420/73; triphenylamethanes as described in Japanese Patent Publication No. 16,052/71 and Japanese Patent Application (OPI) Nos. 92,207/76 and 161,637/79; chromenoindoles as described in Japanese Patent Application (OPI) Nos. 148,099/77 and 126,114/79; and compounds as described in Japanese Patent Application (OPI) Nos. 124,930/75, 111,528/79, 84,238/77, 90,255/78, 29,552/71, and 121,035/76, and Japanese Patent Publication Nos. 12,317/71, 2,530/71, 7,473/80, 25,654/70, 29,552/71, 25,654/70 and 5,929/74.

Of these color formers, those which give dyes with the desired color and weatherability are selected for use in the present invention. Two or more color formers may be used at the same time, if desired.

As color developers of the two-component type color-forming substances, there can be illustrated phenol compounds (e.g., bisphenol A, bisphenol B, 2,2-bis(4-hydroxyphenyl)-n-heptane, 1,1-bis(4-hydroxyphenyl)-cyclohexane, 2-ethyl-1,1'-bis(4-hydroxyphenyl)hexane or like bisphenol A's and phenols usch as 4-phenylphenol and t-butylphenol), organic acids and anhydrides or salts thereof (e.g., salicylic acid derivatives and zinc salts thereof, citric acid, tartaric acid, succinic acid, maleic acid, phthalic acid, phthalic anhydride, tetrachlorophthalic anhydride, p-toluenesulfonic acid and the sodium salt thereof), inorganic salts (e.g., aluminum sulfate, potash alum, ammonium alum, etc.), acid clay, activated clay, kaolin, zeolite, etc. Of these, bisphenols are particularly preferable in the points of the density of formed color, color-forming rate, etc. The molar ratio of color former to color developer generally falls within the range of from 0.1 to 5, more preferably, from 0.3 to 1.

In providing the photopolymerizable element and the dye or dye precursor of the present invention on a support, a binder is preferably used, as the binder, there are used water-soluble polymers preferably having a weight average molecular weight of 5,000 to 1,000,000, such as gelatin, polyvinyl alcohol, polyvinyl pyrrolidone, carboxymethylcellulose, gum arabic, casein, etc., and high molecular weight polymers soluble in organic solvents such as polymethyl methacrylate, polyvinyl chloride, vinylidene chloride/vinyl chloride copolymers, vinylidene chloride/acrylontrile copolymers, polyvinyl acetate, vinyl acetate/vinyl chloride copolymers, styrene/acrylonitrile copolymers, polyesters, ABS resin, polyamides, chlorinated polyethylene, chlorinated polypropylene, polyvinyl butyral, polyvinyl formal, acetyl cellulose, etc.

In the case of using a dye for forming a visible image per the present invention, any of the above-described polymers may be used as binders using water or an organic solvent as a solvent. However, in the case of using a dye precursor, a water-soluble polymer is generally used as a binder using water as a solvent, since the use of an organic solvent can cause dissolution of a color former or color developer, followed by immediate coloration. A proper binder and a proper solvent may be selected depending upon the method of dispersing the monomer and the photopolymerization initiator, i.e., upon whether they are dispersed in the binder as particles or as molecules, taking their solubilities into consideration. As solvents other than water, acetone, toluene, methylene chloride, ethylene dichloride, chloroform, methyl ethyl ketone, ethyl acetate, dimethylformamide, dimethylsulfoxide, etc., can be used.

As the support, polyethylene terephthalate, triacetyl cellulose or a like film, paper, resin-coated paper, etc., can be used.

Materials to be used in the image-recording process of the present invention may have various formulations corresponding to the aforesaid various embodiments (FIGS. 1 to 7).

In the light-sensitive layer shown in FIGS. 1 to 7, the coated amount of the polymerizable vinyl monomer and/or the polymerizable prepolymer ranges preferably from 0.3 to 30 g/m$^2$, more preferably from 1 to 10 g/m$^2$, and the coated amount of binder ranges preferably from 0.1 to 20 g/m$^2$, more preferably from 0.5 to 10 g/m$^2$, with the amount of binder per g of monomer being 0.1 to 10 g, more preferably 0.3 to 3 g. The amount of photopolymerization initiator (amount of photo-reducible dye where a combination of a photo-reducible dye and a reducing agent is used) widely varies depending upon its molecular extinction coefficient, its radical-generating efficiency, etc. but, in general, the amount of the photopolymerization initiator ranges from 0.0005 to 0.05 mol per mol of the monomer, and can be properly selected based on the desired photo-sensitivity, etc.

In cases other than those shown by FIGS. 3, 6 and 7, the monomer may be homogeneously dispersed (molecular dispersion) in the binder, or may be heterogeneously dispersed in particle form as an emulsion or as microcapsules. In general, however, heterogeneous dispersion is better than homogeneous dispersion, since the former is less susceptible to the polymerization-inhibiting effect of oxygen in the air and possesses higher sensitivity than the latter. In conducting molecular dispersion, a solvent capable of dissolving both the monomer and the binder is used to coat them. In dispersing the monomer as an emulsion, a solvent which dissolves the binder but does not dissolve the monomer, particularly water, is used, and the monomer is dispersed in a binder solution generally as an oil-in-water emulsion with the aid of a known surfactant, followed by coating the resulting emulsion.

In dispersing the monomer as microcapsules, monomer microcapsules can be prepared by a coacervation process or the like, as described in Asashi Kondo; "Microcapsules" (Nikkan Kogyo Shinbun-Sha, 1960), and they are dispersed in a binder solution, or monomer particles are microencapsulated in a binder solution in situ.

Where the monomer is dispersed as an emulsion or microcapsules, the photopolymerization initiator may be incorporated in one or both of the non-continuous monomer phase or the continuous binder phase, which is basically decided by the solubilities of the initiator in the monomer and solvent used. Even if the initiator is dispersed only in the continuous binder phase, radicals produced in the continuous phase can enter into monomer particles to cause photopolymerization as long as the weight ratio of monomer to binder is within the aforesaid range.

On the other hand, in the heat-sensitive, color-forming layer in the embodiments shown in FIGS. 1 to 3, the coated amount of the bleachable dye or dye precursor (color former plus color developer) ranges from 0.2 to 20 g/m$^2$, more preferably from 0.5 to 5 g/m$^2$, and that of the binder ranges from 0.02 to 2 g/m$^2$, more preferably from 0.1 to 1 g/m$^2$, with the amount of binder per g of dye or dye precursor being 0.01 to 5 g, more preferably 0.1 to 1.0 g.

In general, the dye may be dispersed either as molecules or as particles but, with the dye precursor, color former and color developer are separately dispersed as particles in a solvent (binder solution) in which they are insoluble for the purpose of preventing color formation before image formation.

As the heat-sensitive, color-forming sheet or layer, known or commercially available heat-sensitive, color-forming paper can be used as it is or after heating to cause uniform coloration, for the image formation of the present invention. The pH in the photopolymerizable element and the heat-sensitive, color-forming layer is desirably adjusted to 2 to 12, more preferably 3 to 10, as bleaching of the dye with the monomer upon image formation takes place only with difficulty at lower pH values, whereas bleaching takes place too much at higher pH values. The light-sensitive layer and the heat-sensitive, color-forming layer generally have a thickness of 0.5 to 30 $\mu$m, more preferably 1 to 10 $\mu$m.

In the case of providing a barrier layer as in the embodiment shown in FIG. 2, polymers as referred to as useful binders are used for the barrier layer. However, it is necessary to select a polymer and a solvent so that the polymer is insoluble or scarcely soluble in a solution to be coated thereon. Particularly in the case where a coating solution to be coated thereon comprises a water-soluble binder and water, a water-insoluble polymer preferably having a weight average molecular weight of 5,000 to 1,000,000, is used as the barrier layer. The thickness of the barrier layer can be decided on a trial-and-error basis so as not to cause any reduction in coloration, etc., but, in general, it ranges from 0.5 to 10 $\mu$m.

In any of the embodiments shown in FIGS. 1 to 3, the weight ratio of monomer to dye or dye precursor must be properly decided. If the amount of monomer is too high, bleaching becomes too high, resulting in a reduction of image density, whereas if the amount of dye or dye precursor is too high, insufficient bleaching takes place to cause fogging. The amount of dye (or color former of a dye precursor) per mol of the monomer generally ranges from 0.1 to 10 mols, more preferably from 0.5 to 5.0 mols. This can be controlled by adjusting ten weight ratio of the monomer the dye or the like, or by adjusting the thickness of each layer.

In the embodiment shown in FIG. 3, the monomer is generally microencapsulated and dispersed in the binder. As wall materials for the microcapsules, the same polymers as used for the aforesaid barrier is preferably used. With respect to the weight ratio of the components, etc., the same applies as with the embodiment of FIG. 2. The thickness of the precursor-containing layer provided on the support ranges from 0.5 to 30 $\mu$m, preferably from 1 to 10 $\mu$m.

In the embodiments shown in FIGS. 4 to 7, the amount of color former in the light-sensitive layer can widely vary depending upon the desired image density and molecular extinction coefficient of the formed dye, and the weight ratio of monomer to color former must be decided so that the produced dye can be completely bleached with the monomer in unexposed areas to form no fog. Proper amounts are preferably determined on a trial-and-error basis and, in general, the color former is used in an amount of 0.1 to 10 mols per mol of the monomer. The color developer in the developing layer is preferably used in an enough amount to color essentially all of the color former as a result of diffusion into the light-sensitive layer upon heating, generally in an amount of 0.05 to 20 g/m$^2$, more preferably 0.5 to 5 g/m$^2$. The amount of binder in the developer layer is generally 0.01 to 10 g, more preferably 0.1 to 3 g, per g of the color developer. The thickness of the developing layer is generally 0.5 to 30 $\mu$m, preferably 1 to 10 $\mu$m.

In the embodiments shown in FIGS. 6 and 7, all color former exists within the monomer particles but, in the embodiments shown in FIGS. 4 and 5, color former may exist within or outside the monomer particles. Where color former exists within the monomer particles, monomer in exposed areas is polymerized to a polymer which in turn functions as a barrier against invasion of color developer and which, upon sufficient heating, allows color developer to diffuse into the polymer and react with color former to form a dye. With layered, mono-sheet type recording materials as shown in FIGS. 5 and 7, a barrier layer can be provided between the light-sensitive layer and the developing layer. The thickness of the barrier layer is generally 0.5 to 10 $\mu$m.

A thermal solvent (functioning as a solvent when heated) may be added to the light-sensitive layer, heat-sensitive, color-forming layer or developer layer of the image-recording material of the present invention for the purpose of accelerating. The migration of reactants upon heating to raise the reaction rate. In the embodiments shown in FIGS. 4 to 7, addition of the thermal solvent is preferred, since the color developer must diffuse a long distance. The thermal solvent has a melting point in the range of devoloping temperatures (80° to 200° C.) and is melted during thermal development to dissolve reactants such as a color developer, etc. It can be selected from a wide scope of compounds with a melting point within the above-described range. Specific examples thereof include sorbitol, dulcitol, pentaerythritol, trimethylolpropane, trimethylolethane, acetamide, methylurea, dimethylurea, etc. In any layer, the amount of the thermal solvent is preferably 0 to 2 g per g of binder.

Dyes produced by the reaction between the color former and color developer can generally be easily bleached with the foregoing monomers. However, with some color developers, bleaching is difficult. In such case, an alkaline substance (e.g., sodium hydroxide, potassium hydroxide, a salt obtained by a reaction thereof with an organic carboxylic acid, a basic phosphoric acid salt, etc.) may be added to the light-sensitive layer, heat-sensitive, color-forming layer or development layer to cause bleaching.

The present invention will now be illustrated in greater detail by reference to the following examples which, however, are not to be construed as limiting the present invention in any way. Unless otherwise stated, percent is expressed as percent by weight.

EXAMPLE 1

Preparation of Light-sensitive Sheet

| | |
|---|---|
| 10 wt % aqueous solution of polyvinyl alcohol (average polymerization degree: 500) | 10 g |
| 5 wt % aqueous solution of a surfactant of the following structure: 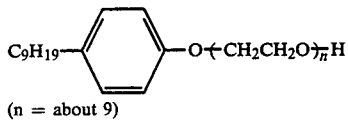 (n = about 9) | 1 g |
| Erythrosine B | 0.01 g |

To a homogeneous solution of the above-described formulation was added a mixture of 0.7 g of pentaerythritol tetraacrylate (monomer), 0.3 g of polyethylene diacrylate (having 14 —OCH$_2$CH$_2$ groups molecular weight: 727), 1 g of ethylene dichloride, and 0.13 g of N-phenylglycine, and the resulting mixture was subjected to ultrasonic emulsification for one hour in a dark room to prepare an emulsion wherein the monomer (and ethylene dichloride) was dispersed in an aqueous solution of Erythrosine B, N-phenylglycine, and polyvinyl alcohol. This was coated on a polyethylene terephthalate film (100 μm thick) using a bar coater, then dried to prepare a pink, light-sensitive sheet. The photopolymerizable layer had a thickness of about 5 μm.

Preparation of heat-sensitive, color-forming sheet:

| | |
|---|---|
| 2-Ethoxyethylamino-3-chloro-6-diethylaminofluoran | 10 g |
| 10 wt % aqueous solution of gelatin | 10 g |
| 5 wt % aqueous solution of sodium p-dodecylbenzenesulfonate | 0.2 g |
| Water | 40 g |

A mixture of the above-described formulation was subjected to dispersing in a homogenizer for one hour together with glass beads which are used for mixing and removed after mixing to prepare Dispersion A.

Then a mixture of the following formulation:

| | |
|---|---|
| 2-Ethyl-1,1'-bis(4-hydroxyphenyl)-hexane | 10 g |
| 10 wt % aqueous solution of gelatin | 10 g |
| 5 wt % aqueous solution of sodium p-dodecylbenzenesulfonate | 0.2 g |
| Water | 40 g | was subjected to dispersing in a homogenizer for one hour together with glass beads to prepare Dispersion B.

5 g of Dispersion A and 10 g of Dispersion B were uniformly mixed and coated on a polyethylene terephthlate film (100 μm thick) using a bar coater, then dried to prepare a sheet containing a colorless, dye precursor (heat-sensitive, color-forming sheet). The heat-sensitive layer had a thickness of about 5 μm.

Image Recording

The light-sensitive sheet was exposed for 30 seconds through a black-and-white step wedge 0.3 in step difference in terms of log (transmission density) with a green filter superposed on the sheet using a halogen lamp with an intensity of 50,000 lux. Then, this sheet was brought into a closs contact with the heat-sensitive, color-forming sheet and uniformly heated for 30 seconds on a 120° C. hot plate to obtain a 5-step black image of the negative-positive response with respect to the original (step wedge). Dmax (maximum transmission density) was 1.0, and Dmin (minimum transmission density) 0.1. A gradation ranging over 5 steps (about 1.5 as log (exposure amount)) was recorded between Dmax and Dmin. After the image was uniformly exposed to room light for about 20 hours, no changes were observed.

Then, the same exposure and development as described about were conducted except for using a red or a blue filter in place of the green filter to obtain no images. That is, the light-sensitive sheet responded only to green light, and not to red light and blue light.

EXAMPLE 2

The colorless, heat-sensitive, color-forming sheet described in Example 1 was uniformly heated for 30 seconds at 120° C. on a hot plate to form a black color all over the surface, a dye-containing, colored, visible image-forming sheet thus being obtained. When the same procedures as in Example 1 were conducted except for using the above-described sheet in place of the colorless, heat-sensitive, color-forming sheet used in Example 1, the same image was obtained.

EXAMPLES 3 TO 5

When the same procedures as in Example 1 were conducted except for using different compounds as given in Table 1 as a color former in place of 2-ethoxyethylamino-3 chloro-6-diethylaminofluoran, there were obtained almost the same results with respect to gradation reproducibility, sensitivity, color sensitivity, etc., with only a slight change in Dmax and Dmin. The color of the image was as shown in Table 1.

TABLE 1

| Example | Color Former | Color of Image |
|---|---|---|
| 3 | 3,6-Bis(N—4-methoxyphenyl-N—phenylamino)fluoran | Cyan (blue) |
| 4 | 3-Diethylamino-7-phenyl-fluoran | Magenta (red) |
| 5 | 3,6-Dimethoxyfluoran | Lemon yellow |

EXAMPLES 6 AND 7

When the same procedures as in Example 1 were conducted except for using bisphenol A or B as color developer in place of 2-ethyl-1,1'-bis(4-hydroxyphenyl)-hexane and changing the developing temperature in Example 6 to 140° C., there were obtained the same results.

TABLE 2

| Example | Color-Developer | Color of Image |
|---|---|---|
| 6 | Bisphenol A | Black |
| 7 | Bisphenol B | Black |

EXAMPLES 8–9

When the same procedures as in Example 1 were conducted except for using different monomers in a varying amount as given in Table 3, there were obtained almost the same results.

TABLE 3

| Example | Polymerizable Monomer Kind | Amount Added | Color of Image |
|---|---|---|---|
| 8 | Trimethylolpropane triacrylate | 1 g | black |
| 9 | Pentaerythritol tetraacrylate | 1 g | black |

EXAMPLE 10

An integrated image-recording material was prepared as follows. A heat-sensitive, color-forming sheet was prepared in the same manner as in Example 1. A 10% solution of polymethyl methacrylate (average molecular weight: about 50,000) in methylene chloride was coated thereon and dried to provide an about 5 μm thick barrier layer. The same photopolymerizable layer as in Example 1 was coated thereon and dried. The resulting assembly was exposed through a step wedge and a green filter and heated in the same manner as in Example 1 to develop a 5-step, negative-positive response type black image. Dmax was 0.8, Dmin was 0.2, and gradation reproduction ranged over 5 steps.

EXAMPLES 11 AND 12

When the same procedures as in Example 1 were conducted except for using photo-reducible dyes and reducing agents as given in Table 4 and changing the color of the filter to that described in Table 4, there were obtained the results given in Table 4. Additionally, the images were all black.

TABLE 4

| Example | Photo-reducible Dye Kind | Added Amount | Reducing Agent Kind | Added Amount | Filter Color | $D_{max}$ | Step Number |
|---|---|---|---|---|---|---|---|
| 11 | Methylene Blue | 0.005 g | Trimethanolamine | 0.05 g | red | 0.4 | 1 |
| 12 | 9,10-Phenanthrenequinone | 0.03 g | (none) |  | blue | 1.0 | 5 |

EXAMPLES 13 TO 22

Light-sensitive sheets were prepared in the same manner as in Example 1 except for adding the photo-reducible dyes described in Table 5 in amounts also described therein in place of 0.01 g of Erythrosine B and adding polymerizable vinyl monomers as described in Table 5 in amounts also described therein in place of 0.7 g of pentaerythritol tetraacrylate and 0.3 g of polyethylene diacrylate, and adding 0.13 g of dimedone in place of N-phenylglycine.

Image were formed in the same manner as in Example 1 using the thus obtained light-sensitive sheets. The results are tabulated in Table 5. Additionally, Dmin values were about 0.1 in all cases.

TABLE 5

| Example | Photo-reducible Dye Kind | Added Amount | Polymerizable Vinyl Monomer Kind | Added Amount | Filter Color | Sensitivity (Step) | $D_{max}$ |
|---|---|---|---|---|---|---|---|
| 13 | Methylene Blue | 0.005 g | Pentaerythritol tetraacrylate | 1 g | red | 7 | 1.5 |
| 14 | Methylene Blue | 0.005 g | Pentaerythritol tetraacrylate / Polyethylene glycol diacrylate (—O—CH$_2$CH$_2$ group: 14) | 0.7 g / 0.3 g | red | 7 | 1.5 |
| 15 | Methylene Blue | 0.005 g | Trimethylolpropane triacrylate | 1 g | red | 7 | 1.5 |
| 16 | Thionine | 0.015 g | Same monomer in the same amount as in Example 14 |  | red / green | 4 / 3 | 0.8 / 0.4 |
| 17 | Rose Bengale | 0.010 g | Same monomer in the same amount as in Example 14 |  | green | 5 | 1.0 |
| 18 | Phloxin-B | 0.010 g | Same monomer in the same amount as in Example 14 |  | green | 6 | 1.2 |
| 19 | Erythrosine-B | 0.020 g | Same monomer in the same amount as in Example 14 |  | green | 7 | 1.3 |
| 20 | Eosine | 0.015 g | Same monomer in the same amount as in Example 14 |  | green | 6 | 1.5 |
| 21 | Safranine | 0.010 g | Same monomer in the same amount as in Example 14 |  | green | 6 | 1.3 |
| 22 | Acriflavin | 0.005 g | Same monomer in the same amount as in Example 14 |  | blue | 6 | 1.5 |

EXAMPLE 23

This example demonstrates the relationship between pH of the light-sensitive layer and light sensitivity in Example 13 (Methylene Blue/dimedone system). Adjustment of pH was conducted by adding a citric acid-Na$_2$HPO$_4$ buffer to a coating solution for the light-sensitive layer, and measurement of pH was conducted by dropping a drop (about 0.2 cc) of water to the light-sensitive layer and using a pH meter with a microprobe. Six light-sensitive materials of a pH of 3.2, 3.5, 4.0, 4.6, 8.0, and 9.0 were prepared, and subjected to the same image-forming procedures as in Example 13. Good images were obtained with samples of a pH of 3.2 to 4.6, but almost no images were obtained with the sample of a pH of 8.0, and no image was obtained with the sample of a pH of 9.0. Samples of a pH of 4.0 and 4.6 had the highest sensitivity and gave high Dmax, thus being the same as the buffer-free light-sensitive material (in Example 1 wherein pH was 4.5). Thus, the photopolymerization degree becomes maximum at a pH of about 4 to about 5.

EXAMPLE 24

On the heat-sensitive, color-forming sheet of Example 1 was coated the following polymerizable composition in a dry thickness of about 10μ, then dried to form a light-sensitive layer, a recording material thus being prepared.

Photopolymerizable composition

A mixture of 2 g of pentaerithritol tetraacrylate and 0.2 g of dimedone was added to a uniform mixture composed of 10 g of a 10 wt% aqueous solution of polyvinyl alcohol (average polymerization degree: 500), 0.5 g of a 5 wt% aqueous solution of sodium p-dodecylbenzenesulfonate, 3 mg of Methylene Blue and 1 g of sorbitol, and subjected to ultrasonic emulsification for one hour in a dark room.

The thus obtained recording material was exposed for 20 seconds through a black-and-white step wedge (0.3 in step difference in terms of log (transmission density) with a red filter superposed on the material using a halogen lamp with an intensity of 50,000 lux. Then, this sheet was uniformly heated for 60 seconds on a hot plate heated to 120° C. to obtain a 7-step black image of the negative-positive response type with respect to the original. The maximum transmission density of the image was 1.5, and the minimum transmission density was 0.1, between which was recorded a gradation of 5 steps of the wedge (1.5 in terms of log (exposure amount)). After the image was uniformly exposed to room light for about 20 hours, no changes were observed.

EXAMPLES 25-28

Preparation of light-sensitive sheet

| | |
|---|---|
| 10 wt % aqueous solution of polyvinyl alcohol (average polymerization degree: 500) | 10 g |
| 1 wt % aqueous solution of a surfactant of the following structure 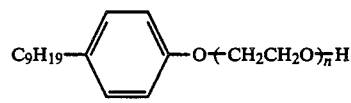 (n = about 9) | 1 g |
| Photo-reducible dye in an amount given in Table 6 | |

To a homogeneous solution of the above-described formulation was added a mixture of a various monomers in varying amounts as described in Table 6, 1 g of ethylene dichloride, and 0.1 g of dimedone. Then, the resulting mixture was subjected to ultrasonic emulsification for one hour in a dark room to prepare emulsions wherein monomers were dispersed in a polyvinyl alcohol aqueous solution. Separately, 10 g of 2-ethoxyethylamino-3-chloro-6-diethylaminofluoran was added to 50 g of a 2 wt% aqueous solution of polyvinyl alcohol (average polymerization degree: 500), then dispersed in a homogenizer for one hour together with glass beads. 1 g of this dispersion was mixed with each of the above-described emulsions, and the resulting mixture was coated on a polyethylene terephthalate film (100 μm thick) using a bar coater, then dried to prepare light-sensitive sheets. The light-sensitive layer had a thickness of about 5 μm.

Preparation of developing sheet 10 g of 2-ethyl-1,1'-bis(4-hydroxyphenyl)hexane was added to 50 g of a 2 wt% aqueous solution of polyvinyl alcohol (average polymerization degree: 500), and subjected to dispersing for one hour in a homogenizer together with glass beads. The thus obtained dispersion was coated on a polyethylene terephthalate film (100 μm thick), and dried to prepare a developing sheet. The developing layer had a thickness of about 5 μm.

Image Recording

Each light-sensitive sheet was exposed for 20 seconds through a black-and-white step wedge (0.3 in step difference in terms of log(transmission density)) with a filter of varying color as described in Table 6 being superposed on the sheet using a halogen lamp with an intensity of 50,000 lux. Then, this sheet was brought into a close contact with the developing sheet and uniformly heated for 30 seconds on a 120° C. hot plate to obtain a black image of the negative-positive response type with respect to the original (step wedge) having good gradation reproducibility. Sensitivities of the images (presented as the step number of the step wedge) are shown in Table 6. All maximum transmission densities (Dmax) of the images were about 2.0, and minimum transmission densities (Dmin) were not more than 0.1. Additionally, when filters of other colors than that of the filter used (for instance, in Example 6, a green or blue filter) were used, absolutely or almost no images were formed.

TABLE 6

| | Photo-reducible Dye | | Monomer | | | |
|---|---|---|---|---|---|---|
| Example | Kind | Added Amount | Kind | Added Amount | Filter Color | Sensitivity (Step) |
| 25 | Methylene Blue | 0.005 g | Pentaerythritol tetraacrylate | 1.5 g | red | 6 |
| 26 | Methylene Blue | 0.005 g | Polyester acrylate ("Aronix" made by Toa Gosei Chemical Industry Co., Ltd.) | 1.5 g | red | 6 |
| 27 | Erythrosine-B | 0.02 g | Pentaerythritol tetraacrylate | 1.5 g | green | 6 |
| 28 | Acriflavin | 0.005 g | Pentaerythritol tetraacrylate | 1.5 g | blue | 5 |

Test on fixing properties

Two sheets of each of the obtained images were peeled apart, and the light-sensitive sheet containing the formed image was cut into two parts, which were respectively subjected to the following tests.

(1) When uniformly irradiated with the same light source as was employed for the imagewise exposure for 5 minutes with an intensity of 50,000 lux, the tested parts underwent no changes in Dmax and Dmin.

(2) When heated for 10 minutes on a 150° C. hot plate with the support side in intimate contact with the hot plate, the tested parts underwent no change in Dmin and only a slight reduction in Dmax.

EXAMPLES 29-30

When the same procedures as described in Example 25 were conducted except for changing the color former to a compound as described in Table 7 (used in the same amount), the negative-positive response type images described in Table 7 were obtained. Sensitivities, gradation reproducibility, Dmin, and Dmax were almost the same as that of black image obtained in Example 25.

TABLE 7

| Example | Color Former | Color of Image |
|---|---|---|
| 29 | 3,6-Bis(N—4-methoxyphenyl-N—phenylamino)fluoran | Cyan |
| 30 | 3-Diethylamino-7-phenylfluoran | magenta |

EXAMPLE 31

When the same procedures as described in Example 25 were conducted except for changing the color developer to the same amount of bisphenol A, there was obtained a negative-positive type black image. Sensitivity, gradation reproducibility, Dmin, and Dmax were almost the same as in Example 25.

EXAMPLE 32

To a uniform solution composed of:

| | |
|---|---|
| 10 wt % aqueous solution of polyvinyl alcohol (average polymerization degree: 500) | 10 g |
| 1 wt % aqueous solution of the surfactant used in Example 25 | 1 g |
| Methylene Blue | 0.005 g | was added a mixture composed of:

| | |
|---|---|
| Pentaerythritol tetraacrylate | 1.5 g |
| Dimedone | 0.1 g |
| Color former used in Example 25 | 1.0 g |
| Ethylene dichloride | 1.0 g |

The resulting mixture was subjected to ultrasonic emulsification for one hour in a dark room, coated on the same support as in Example 25, and dried to prepare a light-sensitive sheet. The light-sensitive layer had a thickness of about 5 μm.

Image recording was conducted in the same manner as in Example 25 using this light-sensitive sheet and the developing sheet of Example 25 to obtain a negative-positive type black image. Sensitivity and gradation reproducibility were the same as in Example 25, and Dmax and Dmin were 1.5 and 0.1, respectively.

While the invention has been described in detail and with reference to specific embodiments thereof, it will be apparent to one skilled in the art that various changes and modifications can be made therein without departing from the spirit and scope thereof.

What is claimed is:

1. An image-recording process which comprises (1) using a photopolymerizable element comprising a polymerizable vinyl monomer and/or a polymerizable prepolymer containing at least one vinyl group, a photopolymerization initiator and a dye capable of being bleached with said vinyl monomer and/or prepolymer or a dye precursor capable of producing said bleachable dye upon heating, (2) conducting imagewise exposure to polymerize said photopolymerizable element, and (3) heating said photopolymerizable element to a temperature between 80° and 200° C. for a period of 3 seconds to 120 seconds, in order to (a) bleach the dye with non-polymerized monomer and/or non-polymerized prepolymer remaining in areas not exposed or exposed in an amount insufficient to cause polymerization, or (b) bleach the dye produced from the dye precursor upon heating, wherein said dye precursor capable of producing said bleachable dye upon heating is a two-component color forming substance consisting of a color former and a color developer and said dye capable of being bleached is a dye obtained by heating said two-component color forming substance or subjecting said two-component color forming substance to solution reaction to form a color.

2. The image-recording process as described in claim 1, wherein a light-sensitive sheet comprising the polymerizable vinyl monomer and/or the polymerizable prepolymer and a photopolymerization initiator is imagewise exposed, the exposed sheet is brought into an intimate contact with a dye sheet comprising the dye capable of being bleached with the polymerizable vinyl monomer and/or the polymerizable prepolymer or is brought into contact with a heat-sensitive, color-forming sheet comprising the dye precursor capable of producing said bleachable dye upon heating, and the resulting assembly is heated.

3. The image-recording process as described in claim 1, wherein an image-recording material having a light-sensitive layer comprising the polymerizable vinyl monomer and/or polymerizable prepolymer and the photopolymerization initiator and a dye layer comprising the dye capable of being bleached with the polymerizable vinyl monomer and/or polymerizable prepolymer or a heat-sensitive, color-forming layer comprising the dye precursor capable of producing said bleachable dye upon heating is imagwise exposed, followed by heating the material.

4. The image-recording process as described in claim 1, wherein an image-receiving material which has a dye layer comprising the dye capable of being bleached with the polymerizable vinyl monomer and/or polymerizable prepolymer or a heat-sensitive, color-forming layer comprising the dye precursor capable of producing said bleachable dye upon heating and which has a mixture of the polymerizable vinyl monomer and/or polymerizable precursor and the photpolymerization initiator dispersed in said dye layer or said heat-sensitive, color-forming layer, is imagewise exposed, and heated.

5. The image-recording process as described in claim 1, wherein a light-sensitive sheet comprising the polymerizable vinyl monomer and/or polymerizable prepolymer, the photo-polymerization initiator, and a color former is imagewise exposed, then the exposed sheet is heated in intimate contact with a developing sheet comprising a color developer.

6. The image-recording process as described in claim 1, wherein a heat-sensitive recording material having a light-sensitive layer comprising the polymerizable vinyl monomer and/or polymerizable prepolymer, the photopolymerization initiator, and a color former and a developing layer comprising a color developer is imagewise exposed, then heated.

7. The image-recording process as described in claim 1, wherein said polymerizable vinyl monomer and/or polymerizable prepolymer is a monomer or a prepolymer of an acrylic acid or methacrylic acid ester.

8. The image-recording process as described in claim 1, wherein said photopolymerization initiator comprises a photo-reducible dye and a reducing agent.

9. The image-recording process as described in claim 8, wherein said reducing agent is dimedone.

10. The image-recording process as described in claim 3, wherein said image-recording material has a barrier layer between the light-sensitive layer and the dye layer or the heat-sensitive, color-forming layer.

11. The image-recording process as described in claim 6, wherein said image-recording material has a barrier layer between the light-sensitive layer and the developing layer.

12. The image-recording process as described in claim 1, wherein said polymerizable vinyl monomer and/or polymerizable prepolymer is heterogeneously dispersed.

13. The image-recording process as described in claim 1, wherein said dye capable of being bleached or dye precursor capable of producing said bleachable dye upon heating can be selected by testing said dye or dye precursor in the presence of an aqueous solution of polyethylene glycol diacrylate on a support such that the dye or dye precursor is bleached to a transparent optical density between 0 and 0.5.

14. The image-recording process as described in claim 1, wherein said color formers are selected from the group consisting of triphenylmethanelactones, fluorans, azaphthalides and diazaphthalides, fluoran-gamma-lactams, phenothiazines, indolylphthalides, spiropyrans, triphenylmethanes and chromenoindols, and said color developers are selected from the group consisting of phenol compounds, organic acids and anhydrides or salts thereof, inorganic salts, acid clays, activated clays, kaolins and zeolites.

* * * * *